US010734688B2

(12) United States Patent
Chae et al.

(10) Patent No.: US 10,734,688 B2
(45) Date of Patent: Aug. 4, 2020

(54) CONSTANT-CURRENT CHARGING AND DISCHARGING METHOD FOR LITHIUM SECONDARY BATTERY BY CONTROLLING CURRENT BASED ON INTERNAL RESISTANCE MEASUREMENT

(71) Applicant: LG Chem, Ltd., Seoul (KR)

(72) Inventors: Oh Byong Chae, Daejeon (KR); Su Min Lee, Daejeon (KR); Eun Kyung Kim, Daejeon (KR); Sun Young Shin, Daejeon (KR)

(73) Assignee: LG Chem, Ltd. (KR)

( * ) Notice: Subject to any disclaimer, the term of this patent is extended or adjusted under 35 U.S.C. 154(b) by 212 days.

(21) Appl. No.: 15/405,359

(22) Filed: Jan. 13, 2017

(65) Prior Publication Data

US 2017/0207497 A1 Jul. 20, 2017

(30) Foreign Application Priority Data

Jan. 19, 2016 (KR) .................. 10-2016-0006443

(51) Int. Cl.
*H01M 10/44* (2006.01)
*H02J 7/00* (2006.01)
(Continued)

(52) U.S. Cl.
CPC .......... *H01M 10/44* (2013.01); *G01R 31/385* (2019.01); *G01R 31/389* (2019.01);
(Continued)

(58) Field of Classification Search
CPC ...... H02J 7/0031; H02J 7/0047; H02J 7/0052; H02J 7/0063; H02J 7/0085; H02J 2007/0067; H02J 7/0013; Y02E 60/12; G01R 31/3648; G01R 31/3627; G01R 31/3662; G01R 31/3651; G01R 31/3624;
(Continued)

(56) References Cited

U.S. PATENT DOCUMENTS

2003/0020434 A1* 1/2003 Fukuoka ............... H02J 7/0073
320/134
2008/0122399 A1* 5/2008 Nishino ............... H02J 7/0075
320/103
(Continued)

FOREIGN PATENT DOCUMENTS

EP  1167988 B1 * 8/2006  ........... G01R 31/362
EP  1167988 B1 * 8/2006  ......... G01R 31/3647
KR  20150099972 A  9/2015

*Primary Examiner* — David V Henze-Gongola
*Assistant Examiner* — Mohammed J Sharief
(74) *Attorney, Agent, or Firm* — Lerner, David, Littenberg, Krumholz & Mentlik, LLP

(57) ABSTRACT

A charging and discharging method for a lithium secondary battery is provided, wherein, while charging or discharging the lithium secondary battery using a constant current, the charge current or allowable discharge current is modified by measuring the internal resistance of the lithium secondary battery. In the charging and discharging method for a lithium secondary battery according to the present disclosure, the charging time and charge capacity, or the discharge current amount and discharge capacity, may be appropriately harmonized, and thus the method may be usefully used as a charging method and a discharging method for a lithium secondary battery.

12 Claims, 3 Drawing Sheets

(51) Int. Cl.
*G01R 31/385* (2019.01)
*G01R 31/389* (2019.01)
*H01M 10/0525* (2010.01)
*H01M 10/052* (2010.01)

(52) U.S. Cl.
CPC ........... *H01M 10/0525* (2013.01); *H02J 7/00* (2013.01); *H02J 7/0013* (2013.01); *H02J 7/0063* (2013.01); *H02J 7/0085* (2013.01); *H01M 10/052* (2013.01); *H02J 2007/0067* (2013.01); *Y02T 10/7055* (2013.01)

(58) Field of Classification Search
CPC .. H01M 10/48; H01M 10/44; H01M 10/0525; H01M 10/052
USPC ................................................. 320/136, 132
See application file for complete search history.

(56) References Cited

U.S. PATENT DOCUMENTS

| | | | | |
|---|---|---|---|---|
| 2010/0244777 | A1* | 9/2010 | Toyota | H02J 7/0069 320/148 |
| 2014/0167706 | A1* | 6/2014 | Sun | H02J 7/0081 320/160 |
| 2015/0051855 | A1* | 2/2015 | Joe | G01R 31/362 702/63 |
| 2015/0153420 | A1* | 6/2015 | Adaniya | G01R 31/382 702/63 |
| 2016/0094067 | A1* | 3/2016 | Li | H02J 7/0052 320/107 |
| 2016/0377684 | A1* | 12/2016 | Leirens | B60L 3/12 702/63 |

\* cited by examiner

CONSTANT-CURRENT CHARGING AND DISCHARGING METHOD FOR LITHIUM SECONDARY BATTERY BY CONTROLLING CURRENT BASED ON INTERNAL RESISTANCE MEASUREMENT

CROSS-REFERENCE TO RELATED APPLICATION(S)

The present application claims priority to and the benefits of Korean Patent Application No. 10-2016-0006443 filed with the Korean Intellectual Property Office on Jan. 19, 2016, the entire contents of which are incorporated herein by reference.

TECHNICAL FIELD

The present disclosure relates to a charging and discharging method for a lithium secondary battery, and more particularly, to a charging and discharging method for a lithium secondary battery, in which the charge current and the discharge current are adjusted according to the internal resistance of the lithium secondary battery.

BACKGROUND ART

As technical development and demand for mobile devices has increased, the demand for secondary batteries as an energy source has increased dramatically. Among such secondary batteries, lithium secondary batteries, which exhibit high energy densities and low operating potentials, and have long cycle lives, and low self discharge rates, have been commercialized and are widely used.

Moreover, as interest in environmental issues has increased recently, there has been much research on electric vehicles (EV) and hybrid electric vehicles (HEV) and the like which are among the leading causes of air pollution. Although nickel-metal hydride (Ni-MH) secondary batteries are typically used as the power source for electric vehicles (EV) and hybrid electric vehicles (HEV) and the like, there has been active research into the use of lithium secondary batteries, which have high energy densities, high discharge voltages, and output stability, some of which have been commercialized.

Meanwhile, metal oxides such as $LiCoO_2$, $LiMnO_2$, $LiMn_2O_4$, or $LiCrO_2$ are used as positive electrode active materials constituting positive electrodes in lithium secondary batteries, and materials comprising metal lithium, carbon based materials such as graphite or activated carbon, or silicon oxides ($SiO_x$) and the like are used as negative electrode active materials constituting negative electrodes. Among the negative electrode active materials, although metal lithium was typically used early on, due to a phenomenon in which lithium atoms on the surface of the metal lithium grow and thereby damage a separator as a charge/discharge cycle proceeds, recently, carbon based materials are typically used.

Carbon based materials, in particular graphite, are reversibly lithiated/delithiated with a significant amount of lithium, up to one lithium per six carbon atoms, without degradation to the mechanical and electrical properties thereof.

The lithiation/delithiation reaction rate is closely dependent on the resistance related to material transport and charge transport processes. Lithium ions move to the surface of graphite through an electrolyte (solution resistance, RS), infiltrate a solid-electrolyte interface (SEI) layer (RSEI), and from the SEI, are inserted into peripheral locations of the graphite (charge transport resistance, RCT), and diffuse along spaces inside the graphite.

Since solid state diffusion of Li+ may be the rate determining step during high-speed charging and discharging, charge transport that results in $LiC_6$ formation is limited. Concentration polarization and resistance polarization induce higher overpotential during high-current charging, and thus cell potential reaches the cut-off voltage before the graphite is completely lithiated. As graphite is lithiated with larger amounts of $Li^+$, the electrochemical environment changes such that the insertion potential of $Li^+$ decreases.

However, current lithium secondary battery charging and discharging methods simplify, rather than reflect, resistance differences dependent on the state of charge (SOC) of graphite. When, as described, charging and discharging is performed without reflecting the resistance differences dependent on the state of change of graphite, not only is the rate of charge/discharge not optimized, the durability of graphite based active materials is also adversely affected.

Thus, there is a need for developing a novel charging method capable of charging a lithium secondary battery at a current density corresponding to the resistance difference dependent on the state of charge of graphite.

DISCLOSURE OF THE INVENTION

Technical Problem

An aspect of the present disclosure is to provide a charging method for a lithium secondary battery, in which the charging time and the charge capacity may be appropriately harmonized by measuring the internal resistance of the lithium secondary battery and modifying the charge current while charging the lithium secondary battery at a constant current.

Another aspect of the present disclosure is to provide a discharging method for a lithium secondary battery, in which the discharge current amount and the discharge capacity may be appropriately harmonized by measuring the internal resistance of the lithium secondary battery and modifying the allowable discharge current while charging the lithium secondary battery at a constant current.

Technical Solution

In accordance with an aspect of the present disclosure, a charging method for a lithium secondary battery is provided. The charging method comprises (1) charging the lithium secondary battery by applying a constant current to the lithium secondary battery; (2) measuring internal resistance by a method of cutting off the constant current and measuring the open-circuit voltage; (3) modifying the value of the constant current used for charging according to the measured internal resistance value; and (4) charging the lithium secondary battery by applying the modified constant current to the lithium secondary battery, wherein, subsequent to operation (4), operations (2) to (4) are sequentially repeated.

In accordance with another aspect of the present disclosure, a discharging method for a lithium secondary battery is provided. The discharging method comprises (1) discharging the lithium secondary battery using a predetermined current value; (2) measuring the internal resistance by a method of cutting off the discharge current and measuring the open-circuit voltage; (3) modifying the allowable discharge current according to the measured internal resistance value; and (4) discharging the lithium secondary battery within the modified allowable discharge current value, wherein, subsequent to operation (4), operations (2) to (4) are sequentially repeated.

Advantageous Effects

A charging and discharging method for a lithium secondary battery according to the present disclosure may appropriately harmonize each of the charging time and charge capacity, and the discharge current amount and discharge capacity, by using a constant current to charge the lithium secondary battery while measuring the internal resistance of the lithium secondary battery to modify each of the charge current and the allowable discharge current. Thus, the charging and discharging method for a lithium secondary battery may be usefully used for charging and discharging lithium secondary batteries.

MODE FOR CARRYING OUT THE INVENTION

Figure 1:
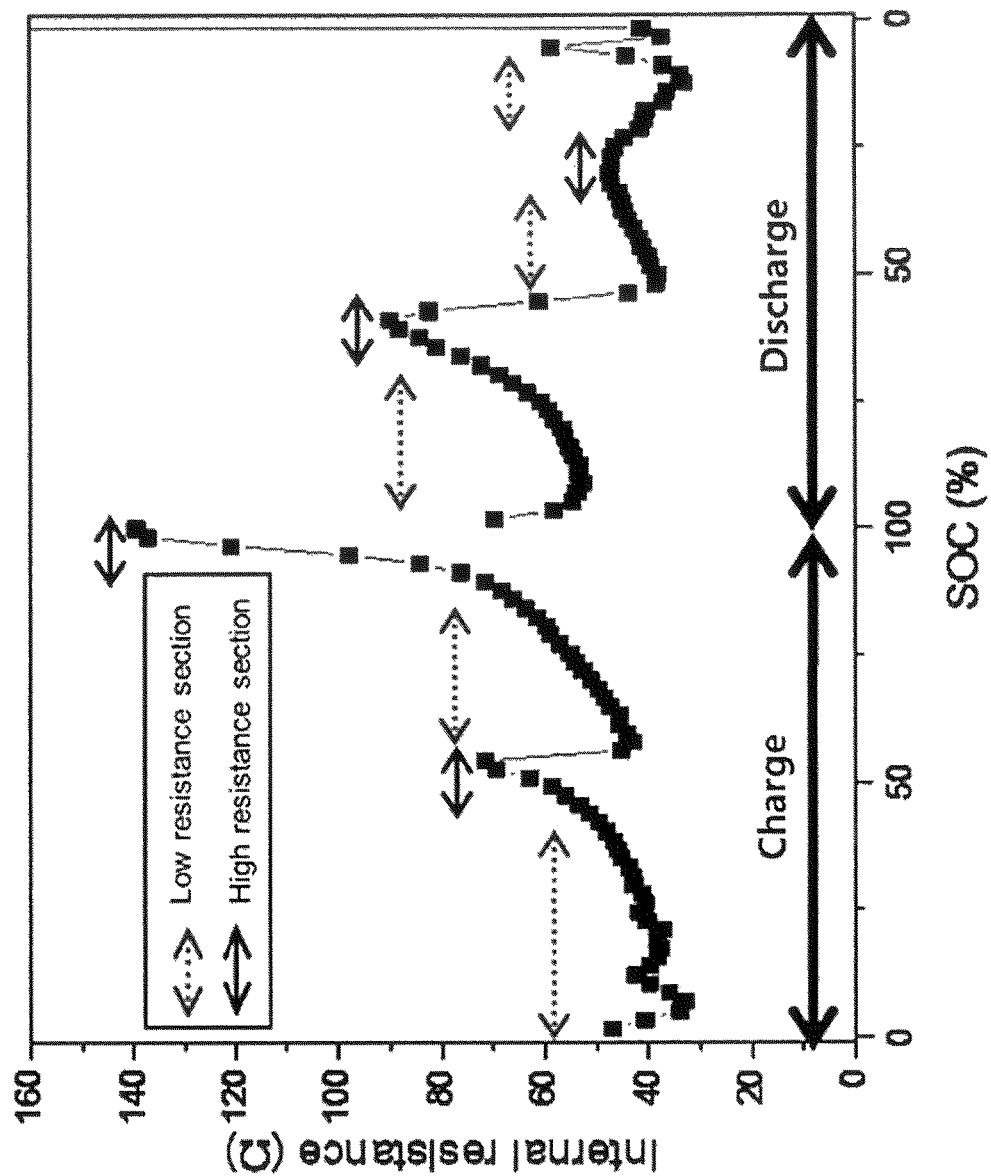
FIG. 1 is a graph showing the resistance value according to state of charge (SOC) for graphite.

Hereinafter, the present disclosure is described in greater detail to facilitate understanding thereof.

Terms or words used in the present specification and claims should not be construed as being limited to their typical or dictionary definitions. Rather, they are to be understood as having meanings which are in accordance with the technical concept of the present disclosure, under the principle that inventors may appropriately define the meanings of such terms to best describe their inventions.

A charging method for a lithium secondary battery of the present disclosure comprises (1) charging a lithium secondary battery by applying a constant current to the lithium secondary battery; (2) measuring internal resistance by a method of cutting off the constant current and measuring the open-circuit voltage; (3) modifying the value of the constant current used for charging according to the measured internal resistance value; and (4) charging the lithium secondary battery by applying the modified constant current to the lithium secondary battery, wherein, subsequent to operation (4), operations (2) to (4) are sequentially repeated.

In a charging method for a lithium secondary battery of the present disclosure, initially, in operation (1), a lithium secondary battery is charged by applying a constant current to the lithium secondary battery.

Here, the lithium secondary battery may be in a discharged state, and charging may be achieved using a relatively high constant current value.

The constant current in operation (1) may be 0.01 to 20 C rate, specifically, 0.05 to 10 C rate, and more specifically, 0.1 to 3 C rate.

In operation (2), the internal resistance is measured by a method of cutting off the constant current applied to the lithium secondary battery in operation (1) and measuring the open-circuit voltage.

The measurement of the internal resistance in operation (2) may be achieved through a method of comparing the voltage of the lithium secondary battery when constant current is applied in order to charge the lithium secondary battery in operation (1), to the voltage of the lithium secondary battery when the constant current is cut off in operation (2).

Here, the internal resistance may be the resistance of a negative electrode comprised in the lithium secondary battery, and the negative electrode may comprise a graphite based active material as a negative electrode active material.

The graphite based active material may be a crystalline carbon, and the crystalline carbon may be a low crystallinity carbon or a high crystallinity carbon. Soft carbon and hard carbon are representative of the low crystallinity carbon, and natural graphite, kish graphite, pyrolytic carbon, mesophase pitch based carbon fiber, meso-carbon microbeads, mesophase pitches, and petroleum or coal tar pitch derived cokes, and the like are representative of the high crystallinity carbon.

The internal resistance may vary according to the state of charge (SOC) of the graphite based active material. Thus, the internal resistance measured in operation (2) may be the lithium secondary battery internal resistance value correspondent to the state of charge (SOC) of the graphite based active material.

In operation (3), the constant current value used for charging is modified according to the measured internal resistance value.

The constant current value, modified in operation (3) according to the measured internal resistance value, may be adjusted so as to be inversely proportional to the measured internal resistance. That is, the constant current value may be made low when the measured internal resistance of the lithium secondary battery is large, and made high when the measured internal resistance of the lithium secondary battery is small.

Specifically, when operations (2) to (4) are sequentially repeated, if the internal resistance value measured in operation (2) increases due to the repetition, the constant current may be reduced in operation (3). When the measured internal resistance value increases by 1%, the constant current value may decrease by 0.1 to 10%, specifically, 0.5 to 5%, and more specifically, 1 to 2%.

Moreover, when operations (2) to (4) are sequentially repeated, if the internal resistance value measured in operation (2) decreases due to the repetition, the constant current may be increased in operation (3). When the measured internal resistance value decreases by 1%, the constant current value may increase by 0.1 to 10%, specifically, 0.5 to 5%, and more specifically, 1 to 2%.

When the lithium secondary battery is charged, lithium ions are inserted into interlayer spaces in graphite. Here, the lithium ions are first inserted into the more thermodynamically favorable layers, and when insertion into the space in the most preferred graphite layer is complete, the lithium ions fill the space in the next most preferred graphite layer. Accordingly, as shown in FIG. 1, the internal resistance exhibits a tendency to increase as the state of charge (SOC) of graphite increases.

Here, when the charging constant current value of the lithium secondary battery is high, lithium ions accumulate at the entrance to interlayer spaces in graphite, and since the rate at which the lithium ions move to, and thereby gather at, a negative electrode is higher than the insertion rate of the lithium ions into the interlayer spaces in the graphite, the lithium ions continuously accumulate at the entrance to the interlayer spaces in the graphite, and thus the internal resistance of the battery steadily increases. Therefore, when the measured internal resistance value is high, that is, when the internal resistance value increases to a set value, it is necessary to reduce the constant current value used for charging, and when the constant current value is reduced in this way, the insertion rate of the lithium ions into the interlayer spaces in the graphite becomes higher than the rate at which the lithium ions move to, and thereby gather at, the negative electrode, and thus the lithium ions are inserted into the interlayer spaces in the graphite in a stable manner.

Thus, when, in operation (3), the constant current value which varies according to the measured internal resistance value is adjusted to be inversely proportional to the measured internal resistance value, if, for example, the constant current value decreases due to an increase in the internal resistance, the lithium ions may be easily inserted into the interlayer spaces in the graphite such that the charge capacity of the lithium secondary battery increases.

In addition, when, as described, the constant current value is reduced in response to the increase in the internal resistance, compared to the internal resistance which naturally increases according to the state of charge, the limitation of additional charging time being consumed as lithium ions accumulate at the entrance of the interlayer spaces in graphite such that internal resistance increases further may be prevented. Moreover, since a high current may be used to quickly carry out charging of the lithium secondary battery when the constant current is increased in response to a decrease in the internal resistance, a fast charging speed, which is one of the most important issues related to the use of lithium secondary batteries, may be achieved.

Since operations (2) and (3) may occur within an extremely short period of time, charging may be continuously performed, even while measuring the internal resistance of a lithium secondary battery in close to real time through operations (2) and (3).

Specifically, in operation (2), measuring the internal resistance by a method of cutting off the constant current and measuring the open-circuit voltage may be realized in 8 ms to 8 s, specifically, 80 ms to 4 s, and more specifically, 400 ms to 2.5 s.

When the constant current cut off time is 8 ms or longer, the internal resistance value may be measured by appropriately measuring the change in the open-circuit voltage of the lithium secondary battery, and when the cut off time is 8 s or shorter, the increase in charging time resulting from the cut off of the charge current may be minimized to within an appropriate range.

Next, when operations (2) to (4) are sequentially repeated after the completion of operation (4), operation (3) is achieved in real time, and operation (4) may be achieved in the same amount of time as operation (1). Accordingly, charging may be carried out, while continuously measuring the internal resistance of the lithium secondary battery in close to real time, by measuring the internal resistance of the lithium secondary battery within an extremely short period of time.

Each of operation (1), in which a lithium secondary battery is charged by applying a constant current to the lithium secondary battery, and operation (4), in which the lithium secondary battery is charged by applying a modified constant current, may be realized in 10 ms to 100 s, specifically, 100 ms to 50 s, and more specifically, 200 ms to 10 s.

In an example of the present disclosure, the charging method for a lithium secondary battery may be used to charge a battery module comprising a single battery cell or two or more battery cells.

When the charging method for a lithium secondary battery is used to charge a battery module comprising two or more battery cells, each of the operations in the charging method may be carried out independently for each of the unit battery cells comprised in the battery module.

For example, when an operation for measuring the internal resistance according to operation (2) or an operation for modifying the constant current value used for charging according to operation (3) is carried out on any one of the battery cells among the two or more battery cells comprised in the battery module, operation (1) or (4) may be carried out on another of the battery cells. As such, lengthening of the overall battery module charging time may be minimized by carrying out operation (1) or operation (4) on another of the unit battery cells when carrying out operation (2), for measuring the internal resistance, and operation (3), for modifying the constant current value used for charging on the basis thereof, on any one of unit battery cells in a battery module comprising two or more of the battery cells.

In addition, the present disclosure provides a discharging method for a lithium secondary battery.

A discharging method for a lithium secondary battery of the present disclosure comprises (1) discharging the lithium secondary battery using a predetermined current value; (2) measuring the internal resistance by a method of cutting off the discharge current and measuring the open-circuit voltage; (3) modifying the allowable discharge current according to the measured internal resistance value; and (4) discharging the lithium secondary battery within the modified allowable discharge current value, wherein, subsequent to operation (4), operations (2) to (4) are sequentially repeated.

Here, the lithium secondary battery may be in a charged state, and discharging may be carried out at a relatively high current value.

The current value in operation (1) may be 0.01 to 20 C rate, specifically, 0.05 to 10 C rate, and more specifically, 0.1 to 3 C rate.

In operation (2), the internal resistance is measured by a method of cutting of the discharge current of operation (1) and measuring the open-circuit voltage.

The measurement of the internal resistance in operation (2) may be achieved through a method of comparing the voltage of the lithium secondary battery during discharge in operation (1), to the voltage of the lithium secondary battery when the discharge current is cut off in operation (2).

Here, the internal resistance may be the resistance of a negative electrode comprised in the lithium secondary battery, and the negative electrode may comprise a graphite based active material as a negative electrode active material. The graphite based active material may be the graphite based active material mentioned when describing the charging method.

The internal resistance may vary according to the state of charge (SOC) of the graphite based active material. Thus, the internal resistance measured in operation (2) may be the lithium secondary battery internal resistance value correspondent to the state of charge (SOC) of the graphite based active material.

In operation (3), the allowable discharge current is modified according to the measured internal resistance value.

The allowable discharge current value, modified in operation (3) according to the internal resistance value measured in operation (2), may be adjusted so as to be inversely proportional to the measured internal resistance value. That is, when the measured internal resistance value of the lithium secondary battery is large, the allowable discharge current value may be made low, and when the measured internal resistance value of the lithium secondary battery is small, the allowable discharge current value may be made high.

Specifically, when operations (2) to (4) are sequentially repeated, if the internal resistance value measured in operation (2) increases, the allowable discharge current may be reduced in operation (3). When the measured internal resistance value increases by 1%, the allowable discharge current value my decrease by 0.1 to 10%, specifically, 0.5 to 5%, and more specifically, 1 to 2%.

Moreover, when operations (2) to (4) are sequentially repeated, if the internal resistance value measured in operation (2) decreases due to the repetition, the allowable discharge current may be increased in operation (3). When the measured internal resistance value decreases by 1%, the constant current value may increase by 0.1 to 10%, specifically, 0.5 to 5%, and more specifically, 1 to 2%.

When the lithium secondary battery is discharged, lithium ions which have been inserted into interlayer spaces in graphite are released. Here, the lithium ions located in thermodynamically unstable layers are released first, and the lithium ions located in layers which are more thermodynamically stable are released later.

As shown in FIG. 1, during the discharge of a lithium secondary battery, the internal resistance of graphite increases gradually in a certain region, before decreasing in steps. This is because, during the course of a staging process in which the graphite releases lithium in steps, as the structure changes from stage 1 to stage 4 due to the release of lithium, deintercalation of the lithium ions from the graphite occurs easily in the initial phase of each stage, but becomes difficult in the final phases of each stage. Therefore, when the measured internal resistance value is high, that is, when the internal resistance value increases to a set value, it is necessary to reduce the allowable discharge current value. Conversely, when the measured internal resistance value is low, that is, when the internal resistance value decreases to a set value, the allowable discharge current may be increased to increase the output of the lithium secondary battery.

Since operations (2) and (3) may occur within an extremely short period of time, discharging may be continuously performed, even while measuring the internal resistance of a lithium secondary battery in close to real time through operations (2) and (3).

In operation (2), measuring the internal resistance by a method of cutting off the discharge current and measuring the open-circuit voltage may be realized in 8 ms to 8 s, specifically, 80 ms to 4 s, and more specifically, 400 ms to 2.5 s.

When the discharge current cut off time is 8 ms or longer, the internal resistance value may be measured by appropriately measuring the change in the open-circuit voltage of the lithium secondary battery, and when the discharge current cut off time is 8 s or longer, it is possible not to cause the limitation of power quality being degraded due to the cut off of the discharge current.

Repeated after the completion of operation (4), operation (3) is achieved in real time, and operation (4) may be achieved in the same amount of time as operation (1). Accordingly, the lithium secondary battery may be efficiently discharged, while continuously measuring the internal resistance of the lithium secondary battery in close to real time, by measuring the internal resistance of the lithium secondary battery within an extremely short period of time.

Each of operation (1), for discharging a lithium secondary battery using a predetermined current value, and operation (4), for discharging the lithium secondary battery within a modified allowable discharge current, may be realized in 10 ms to 100 s, specifically, 100 ms to 50 s, and more specifically, 200 ms to 10 s.

In an example of the present disclosure, the discharging method for a lithium secondary battery may be used to discharge a battery module comprising a single battery cell or two or more battery cells.

When the discharging method for a lithium secondary battery is used to discharge a battery module comprising two or more battery cells, each of the operations in the discharging method may be carried out independently for each of the unit cells comprised in the battery module.

For example, when an operation for measuring the internal resistance according to operation (2) or an operation for modifying the allowable discharge current according to operation (3) is carried out on any one of the battery cells among the two or more battery cells comprised in the battery module, operation (1) or (4) may be carried out on another of the battery cells. As such, the limitation in which the discharge current of an overall battery module is cut off or becomes unstable may be overcome by carrying out operation (1) or operation (4) on another of the unit battery cells when carrying out operation (2), for measuring the internal resistance, and operation (3) for modifying the allowable discharge current on the basis thereof, on any one of unit battery cells in a battery module.

Meanwhile, in the present disclosure, the lithium secondary battery may comprise a negative electrode, and a separator interposed between the positive electrode and the negative electrode.

The positive electrode may be manufactured using a typical method that is well-known in the field. For example, the positive electrode may be manufactured by mixing and stirring a positive electrode active material with a solvent and, as needed, a binder, a conductive material, or a dispersing agent to prepare a slurry, and then coating the slurry onto a current collector made of a metal material, compressing, and drying.

The current collector made of a metal material is a highly conductive metal. The metal is not particularly limited when the metal is a metal to which the slurry in the positive electrode active material is able to easily adhere, does not cause chemical changes to the battery in the voltage range of the battery, and is highly conductive. For example, stainless steel, aluminum, nickel, titanium, or baked carbon, or alumina or stainless steel which has been surface treated with carbon, nickel, titanium, or silver and the like may be used. Moreover, fine hills and valleys may be formed on the current collector surface and increase the adhesiveness with the positive electrode active material. The current collector may be used in various forms, such as a film, a sheet, a foil, a net, a porous body, a foam body, a non-woven fabric body, etc., and have a thickness of 3 to 500 μm.

The positive electrode active material may be, for example, lithium cobalt oxide ($LiCoO_2$); lithium nickel oxide ($LiNiO_2$); $Li[Ni_aCo_bMn_cM^1_d]O_2$ (where $M^1$ is one or two or more elements selected from the group consisting of Al, Ga, and In, $0.3 \leq a < 1.0$, $0 \leq b \leq 0.5$, $0 \leq c \leq 0.5$, $0 \leq d \leq 0.1$, and $a+b+c+d=1$); a layered compound such as $Li(Li_eM^2_{f-e-f'}M^3_{f'})O_{2-g}A_g$ (where $0 \leq e \leq 0.2$, $0.6 \leq f \leq 1$, $0 \leq f' \leq 0.2$, $0 \leq g \leq 0.2$, $M^2$ comprises Mn and at least one selected from the group consisting of Ni, Co, Fe, Cr, V, Cu, Zn, and Ti, $M^3$ is at least one selected from the group consisting of Al, Mg, and B, and A is at least one selected from the group consisting of P, F, S, and N) or a compound substituted with one or more transition metals; a lithium manganese oxide such as $Li_{1+h}Mn_{2-h}O_4$ (where $0 \leq h \leq 0.33$), $LiMnO_3$, $LiMn_2O_3$, or LiMnO$_2$; lithium copper oxide (Li$_2$CuO$_2$); a vanadium oxide such as LiV$_3$O$_8$, V$_2$O$_5$, or Cu$_2$V$_2$O$_7$; a Ni site type lithium nickel oxide represented by chemical formula LiNi$_{1-i}$M$^4_i$O$_2$ (where M$^4$=Co, Mn, Al, Cu, Fe, Mg, B, or Ga, and 0.01≤i≤0.3); a lithium manganese composite oxide represented by chemical formula LiMn$_{2-j}$M$^5_j$O$_2$ (where M$^5$=Co, Ni, Fe, Cr, Zn, or Ta, and 0.01≤j≤0.1) or Li$_2$Mn$_3$M$^6$O$_8$ (where M$^6$=Fe, Co, Ni, Cu, or Zn); LiMn$_2$O$_4$ in which some of the Li in the chemical formula has been substituted with an alkali earth metal ion; a disulfide compound; or LiFe$_3$O$_4$, Fe$_2$(MoO$_4$)$_3$ and the like, but is not limited thereto.

The solvent for forming the positive electrode may be an organic solvent, such as n-methylpyrrolidone (NMP), dimethylformamide (DMF), acetone, dimethylacetamide, etc., or water and the like, and such solvents may be used alone or by mixing two or more thereof. The amount of solvent used is sufficient if capable of dissolving and dispersing the positive electrode active material, binder, and conductive material, in consideration of the coating thickness and production yield of the slurry.

Various types of binder polymers may be used as the binder, such as polyvinylidene fluoride-hexafluoropropylene copolymer (PVDF-co-HFP), polyvinylidene fluoride, polyacrylonitrile, polymethylmethacrylate, polyvinyl alcohol, carboxymethyl cellulose (CMC), starch, hydroxypropyl cellulose, regenerated cellulose, polyvinylpyrrolidone, tetrafluoroethylene, polyethylene, polypropylene, polyacrylic acid, ethylene-propylene-diene monomer (EPDM), sulfonated EPDM, styrene butadiene rubber (SBR), fluororubber, or polyacrylic acid and various copolymers in which the hydrogen atoms thereof are substituted with Li, Na, or Ca and the like.

The conductive material is not particularly limited when the conductive material is one which does not cause chemical changes in the battery and is conductive. For example, conductive materials may be used, comprising graphites such as natural or synthetic graphite; carbon blacks such as acetylene black, Ketjen black, channel black, furnace black, lamp black, or thermal black; conductive fibers such as carbon fibers or metal fibers; conductive tubes such as carbon nanotubes; metal powders such as fluorocarbon, aluminum, or nickel powder; conductive whiskers such as zinc oxide or potassium titanium oxide; conductive metal oxides such as titanium oxide; and polyphenylene derivatives. The conductive material may be used in an amount of 1 to 20 wt % with respect to the total weight of the positive electrode slurry.

An aqueous dispersing agent or an organic dispersant such n-methyl-2-pyrollidone may be used as the dispersing agent.

The negative electrode may be manufactured using a typical method that is well-known in the field. For example, the negative electrode may be manufactured by mixing and stirring a negative electrode active material with a binder and additives, such as a conductive material, to prepare a negative electrode active material slurry, and then coating the negative electrode active material slurry onto a negative electrode current collector, drying, and compressing.

The solvent for forming the negative electrode may be an organic solvent, such as n-methylpyrrolidone (NMP), dimethylformamide (DMF), acetone, dimethylacetamide, etc., or water and the like, and such solvents may be used alone or by mixing two or more thereof. The amount of solvent used is sufficient if capable of dissolving and dispersing the negative electrode active material, binder, and conductive material, in consideration of the coating thickness and production yield of the slurry.

The binder may be used to maintain a molded body by binding negative electrode active material particles. The binder is not particularly limited when the binder is one typically used in preparing slurries for negative electrode active materials. For example, polyvinyl alcohol, carboxymethyl cellulose, hydroxypropylene cellulose, diacetylene cellulose, polyvinylchloride, polyvinylpyrrolidone, polytetrafluoroethylene (PTFE), polyvinylidene fluoride (PVdF), polyethylene, or polypropylene and the like, which are aqueous binders, may be used. In addition, one selected from the group consisting of acrylonitrile-butadiene rubber, styrene-butadiene rubber, and acrylic rubber, which are aqueous binders, or a mixture of two or more thereof may be used. Compared to non-aqueous binders, such aqueous binders are economic and environmentally friendly, and are not harmful to the health of operators. Since the binding effect of such aqueous binders is superior to that of non-aqueous binders, the ratio of active material present in an equivalent volume of binder may be increased, which enables increased capacity. Styrene-butadiene rubber may be desirably used as the aqueous binder.

The binder may be make up at most 10 wt % of the total weight of the slurry for the negative electrode active material, specifically, 0.1 to 10 wt %. It is undesirable for the binder content to be less than 0.1 wt % since the effect achieved by using the binder is negligible, and it is undesirable for the binder content to be greater than 10 wt % since it is possible for the per-volume capacity to be degraded due to the relative decrease in the active material content that results from the increased binder content.

The conductive material is not particularly limited when the conductive material is one which does not cause chemical changes in the battery and is conductive. For example, conductive materials may be used, comprising graphites such as natural or synthetic graphite; carbon blacks such as acetylene black, Ketjen black, channel black, furnace black, lamp black, or thermal black; conductive fibers such as carbon fibers or metal fibers; metal powders such as fluorocarbon, aluminum, or nickel powder; conductive whiskers such as zinc oxide or potassium titanium oxide; conductive metal oxides such as titanium oxide; and polyphenylene derivatives. The conductive material may be used in an amount of 1 to 9 wt % with respect to the total weight of the slurry for the negative electrode active material.

The negative electrode current collector used in the negative electrode according to an embodiment of the present disclosure may have a thickness of 3 μm to 500 μm. The negative electrode current collector is not particularly limited when the negative electrode current collector is one which is conductive and does not cause chemical changes to the battery. For example, copper, gold, stainless steel, aluminum, nickel, titanium, or baked carbon, or copper, stainless steel which has been surface treated with carbon, nickel, titanium, silver, etc., or an aluminum-cadmium alloy and the like may be used as the negative electrode current collector. Moreover, fine hills and valleys may be formed on the surface to increase the binding with the negative electrode active material. The negative electrode current collector may be used in various forms, such as a film, a sheet, a foil, a net, a porous body, a foam body, or a non-woven fabric body and the like.

In addition, for the separator, a typical porous polymer film typically used as a separator, for example, a porous polymer film prepared using a polyolefin based polymer, such as an ethylene homopolymer, a propylene homopolymer, an ethylene-butene copolymer, an ethylene-hexene copolymer, or an ethylene-methacrylate copolymer, may be used alone or such porous polymer films may be used by being laminated; or a typical porous non-woven fabric, for example, a non-woven fabric made of a high melting point glass fiber or polyethylene terephthalate fiber and the like may be used, but the separator is not limited thereto.

Lithium salts which are typically used as electrolytes for lithium secondary batteries may be used without limit as a lithium salt which may be comprised as an electrolyte used in the present disclosure. An anion in the lithium salt may, for example, be one selected from the group consisting of $F^-$, $Cl^-$, $Br^-$, $I^-$, $NO_3^-$, $N(CN)_2^-$, $BF_4^-$, $ClO_4^-$, $PF_6^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$, and $(CF_3CF_2SO_2)_2N^-$.

An organic solvent typically used in electrolyte solutions for secondary batteries may be used without limit as an organic solvent comprised in an electrolyte solution used in the present disclosure. Representatively, one selected from the group consisting of propylene carbonate (PC), ethylene carbonate (EC), diethyl carbonate (DEC), dimethyl carbonate (DMC), ethyl methyl carbonate (EMC), methyl propyl carbonate, dipropyl carbonate, dimethyl sulfur oxide, acetonitrile, dimethoxyethane, diethoxyethane, vinylene carbonate, sulfolane, gamma-butyrolactone, propylene sulfite, and tetrahydrofuran, or a mixture of two or more thereof, may be used. Specifically, ethylene carbonate and propylene carbonate may be desirably used since, among the carbonate based organic solvents, ethylene carbonate and propylene carbonate, which are cyclic carbonates, are high viscosity organic solvents that have high permittivities, and thus are highly capable of dissociating lithium salts in an electrolyte. Since a highly conductive electrolyte solution may be prepared by adding low viscosity, low permittivity linear carbonates to such cyclic carbonates in an appropriate ratio, the cyclic carbonates may be more desirably used.

Selectively, the electrolyte solution stored according to the present disclosure may further comprise additives, such as an overcharge-preventing agent, comprised in typical electrolyte solutions.

The external appearance of the lithium secondary battery is not particularly limited, and may be a cylindrical type that utilizes a can, an angular type, a pouch type, or a coin type and the like.

The lithium secondary battery may be used in a battery cell used as a power source for a small-sized device, and may be a unit battery of a battery module comprising a high number of battery cells or a mid- or large-sized battery module used in a mid- or large-sized device.

Exemplary examples of the mid- or large-sized device may comprise electric vehicles, hybrid electric vehicles, plug-in hybrid electric vehicles, and power storage systems, but are not limited thereto.

EXAMPLES

Hereinafter, examples and experimental examples are provided to describe the present disclosure in greater detail. However, the present disclosure is not limited by the examples and experimental examples. The examples according to the present disclosure may be modified into various forms, and the scope of the present disclosure should not be construed as being limited to the examples described below.

The examples of the present disclosure are provided to more completely describe the present disclosure to a person with average skill in the field.

Example

<Manufacture of Lithium Secondary Battery>

A negative electrode mixture slurry was prepared by adding 96 wt % of natural carbon as a negative electrode active material, 1 wt % of Denka black (conductive agent), 2 wt % of styrene butadiene rubber (SBR, binder), and 1 wt % of carboxymethyl cellulose (CMC, viscosity enhancer) to water. The prepared negative electrode mixture slurry was coated to a thickness of 65 μm onto one side of a copper current collector, dried, rolled, and then punched into a predetermined size to manufacture a negative electrode.

Lithium (Li) metal was used as a counter electrode. After a polyolefin separator was interposed between the negative electrode and the Li metal, an electrolyte solution with 1 M $LiPF_6$ dissolved therein was injected into a solvent having mixed therein ethylene carbonate (EC), propylene carbonate (PC), and ethyl methyl carbonate (EMC) in a volume ratio of 20:10:70 to manufacture a coin-type half cell.

<Charging and Discharging>

Figure 2:
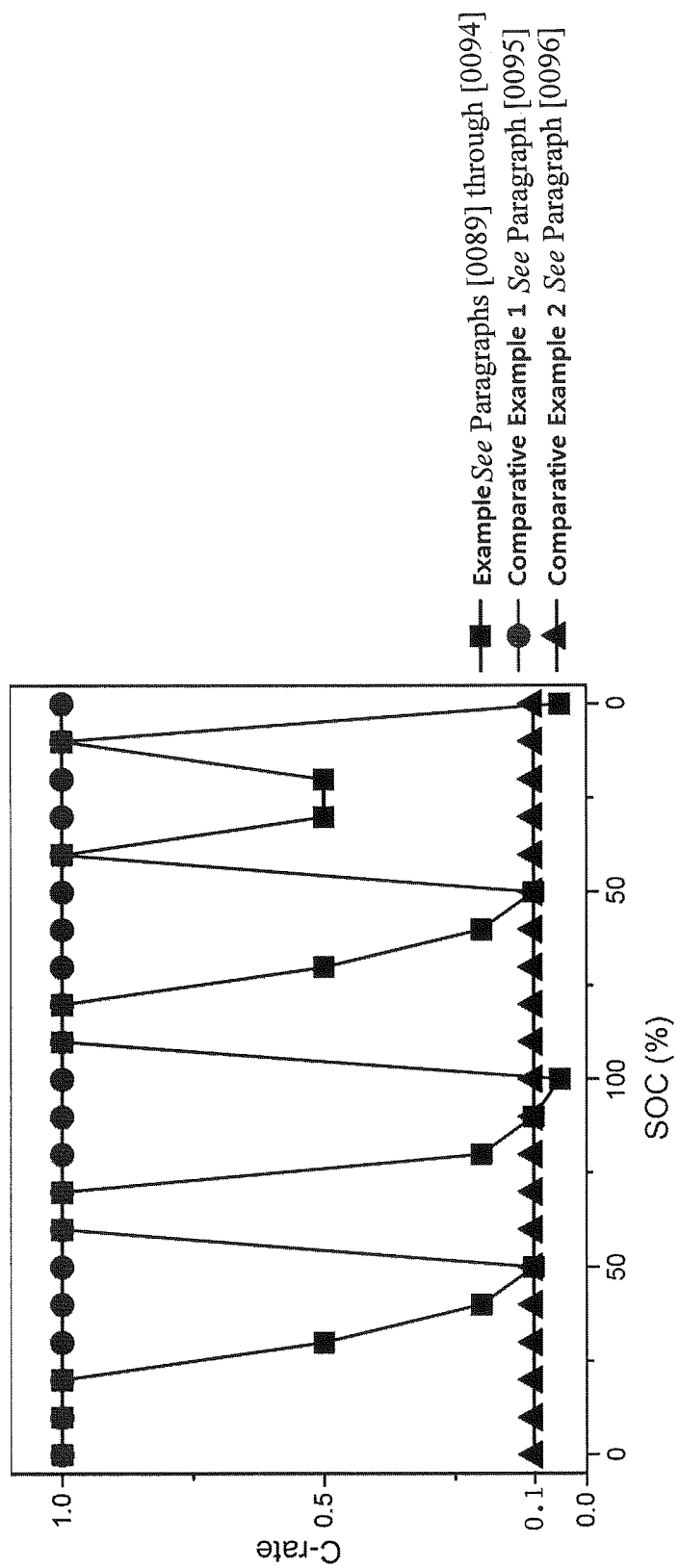
FIG. 2 is a graph showing the constant current (C-rate) value during charging according to state of charge (SOC) in the Example and Comparative Examples 1 and 2.
Figure 3:
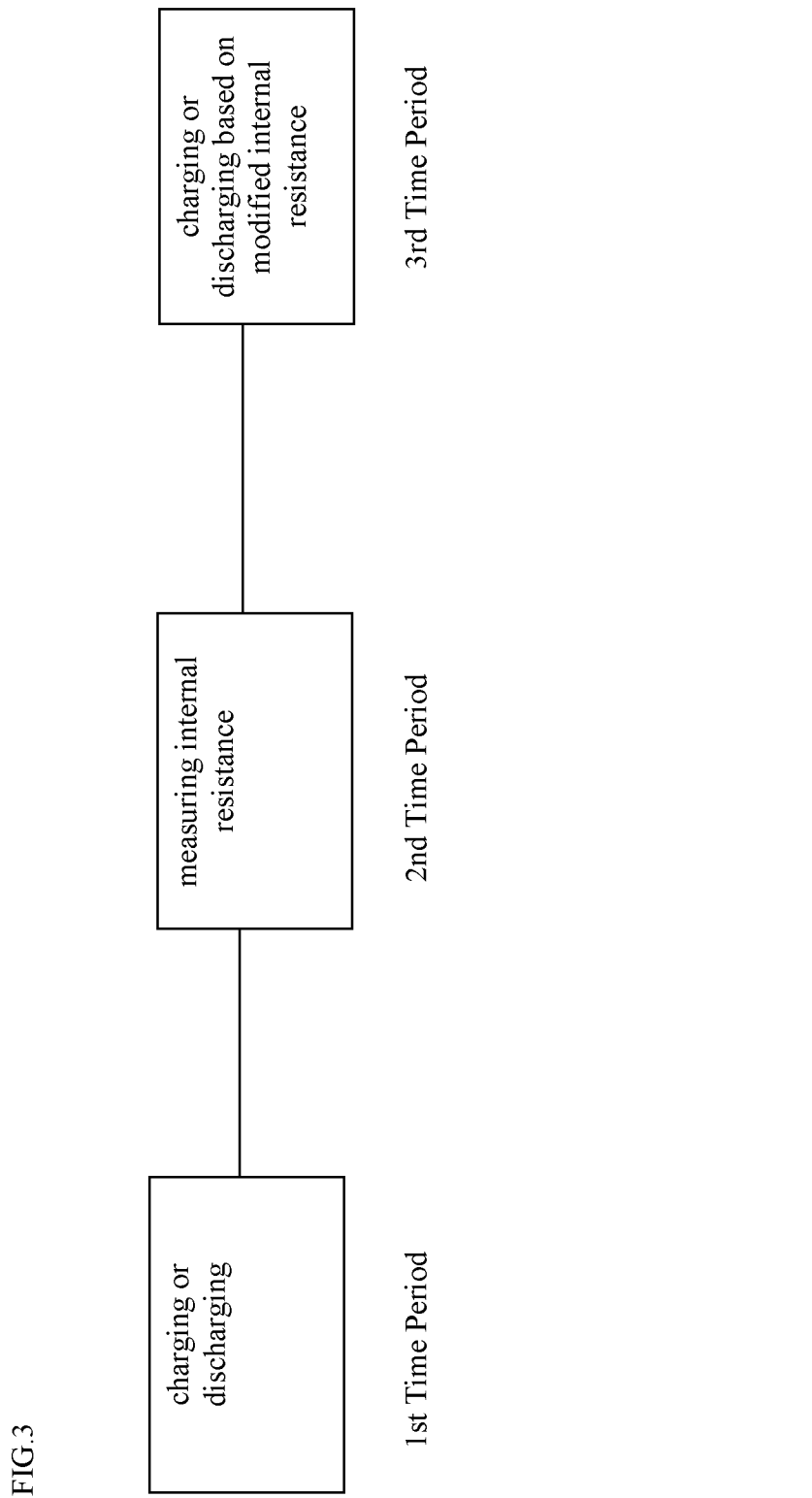
FIG. 3 is a representation in the form of a block diagram of the principle steps in carrying out the present invention.

The coin-type half-cell manufactured above was charged and discharged using an electrochemical charger/discharger. Charging was performed until a voltage of 0.005V vs. Li/Li+ was reached, and discharging was performed until 1.5V vs. Li/Li+ was reached. Here, as shown in FIG. 2, the charge/discharge current density was fluidly varied according to changes in resistance which occurred according to the state of charge (SOC). Charge/discharge was fluidly performed at current densities of 1 C-rate in low resistance sections to 0.05 C-rate in high resistance sections.

Here, using an electrochemical workstation (WonA Tech, ZIVE SP1), the internal resistance of the cell was measured using a method of cutting off the constant current or discharge current for 10 ms and measuring the open-circuit voltage. Excluding the time during which the constant current was cut off when measuring the internal resistance, charging of the cell was achieved in 500 ms to 2 s. Excluding the time during which the discharge current was cut off when measuring the internal resistance, discharging of the cell was achieved in 1 s to 3.

Comparative Example 1

Using the lithium secondary battery manufactured using the same method as in the Example, charging and discharging were performed using the same method as used in the charge/discharge experiment of the Example, other than that charging and discharging were performed using a constant current of 1 C.

Comparative Example 2

Using the lithium secondary battery manufactured using the same method as in the Example, charging and discharging were performed using the same method as used in the charge/discharge experiment of the Example, other than that charging and discharging were performed using a constant current of 0.1 C.

Experimental Example 1: Evaluation of Electrochemical Properties

Capacity efficiency was calculated by measuring charge capacity and discharge capacity during the course of charging and discharging in the Example and Comparative Examples 1 and 2.

In addition, after repeating the charging and discharging in the Example and Comparative Examples 1 and 2 for 100 cycles, the capacity retention ratio after 100 cycles was measured, and the results thereof are displayed in Table 1 below.

Experimental Example 2: Observation of Lithium Precipitation

The cells used in the Example and Comparative Examples 1 and 2 were disassembled, and after the negative electrode graphite surfaces thereof were observed using an optical microscope, the extent of lithium precipitation was also displayed in Table 1.

TABLE 1

|  | Example | Comparative Example 1 | Comparative Example 2 |
|---|---|---|---|
| Capacity efficiency of first cycle (%) | 94 | 79 | 89 |
| Capacity efficiency after 100 cycles (%) | 98 | 53 | 91 |
| Extent of lithium precipitation | almost none | severe | small amount observed |
| Charge time (hours) | 2.1 | 0.9 | 10.9 |
| Discharge time (hours) | 2.0 | 0.7 | 9.7 |

Referring to Table 1, in the lithium secondary battery charged and discharged according to the charging method and discharging method of the present disclosure, since the charge current value and the allowable discharge current values are modified according to the state of charge of the graphite by measuring the internal resistance of the lithium secondary battery, the battery may be charged and discharged according to the rate at which lithium is inserted and released from the graphite in the negative electrode. Accordingly, lithium precipitation is nearly nonexistent, high capacity efficiency is exhibited, and the battery is not subjected to shock or overload, and thus it can be observed that a high capacity retention ratio is exhibited even after 100 cycles.

Conversely, although the battery in Comparative Example 1, in which charging and discharging were performed by maintaining a high constant current value of 1 C, had a shorter charge/discharge time than the Example and Comparative Example 2, the amount of lithium precipitation that occurred was large enough to be severe. Accordingly, it was observed that capacity efficiency was low and capacity retention ratio was greatly reduced after 100 cycles.

Meanwhile, although the battery in Comparative Example 2, in which charging and discharging were performed by maintaining a low constant current value of 0.1 C, was superior to the battery in Comparative Example 1 in terms of capacity efficiency and capacity retention ratio after 100 cycles, in situations in which the state of charge of the graphite is high, even a current of 0.1 C is high compared to the appropriate current value, and thus a small amount of lithium precipitation occurred. Accordingly, it was observed that capacity efficiency and capacity retention ratio after 100 cycles was lower than the battery in the Example. Moreover, in Comparative Example 2, charging and discharging were performed by maintaining a relatively low constant current value of 0.1 C, and thus, it was observed that the time required for charging and discharging was extremely long.

What is claimed is:

1. A charging method for a lithium secondary battery, the charging method comprising:
   (1) charging the lithium secondary battery by applying a constant current for a first time period to provide an applied voltage, said lithium secondary battery have an open-circuit voltage where the constant current is cut off;
   (2) measuring an internal resistance in order to determine a measured internal resistance by a method of cutting off the constant current and measuring the open-circuit voltage for a second time period and comparing the applied voltage to the open-circuit voltage;
   (3) modifying the value of the constant current to a modified constant current value used for charging according to the measured internal resistance value;
   (4) charging the lithium secondary battery by applying the modified constant current value for a third time period; and (5) sequentially repeating operations (2) to (4);
   wherein each of operations (1) and (4) is performed during the first and third time periods 10 ms to 100 seconds,
   wherein in operation (2) the measuring of the internal resistance by the method of cutting off the constant current and measuring the open-circuit voltage is performed during the second time period of 8 ms to 8 seconds,
   wherein the internal resistance is the resistance of a negative electrode comprised in the lithium secondary battery.

2. The charging method of claim 1, wherein the constant current value, modified in operation (3) according to the measured internal resistance value, is adjusted so as to be inversely proportional to the measured internal resistance.

3. The charging method of claim 1, wherein, when operations (2) to (4) are sequentially repeated, when the internal resistance value measured in operation (2) increases, the constant current is decreased in operation (3).

4. The charging method of claim 3, wherein, when the measured internal resistance value increases by 1%, the constant current value decreases by 0.1 to 10%.

5. The charging method of claim 1, wherein, when operations (2) to (4) are sequentially repeated, when the internal resistance value measured in operation (2) decreases, the constant current is increased in operation (3).

6. The charging method of claim 5, wherein, when the measured internal resistance decreases by 1%, the constant current value increases by 0.1 to 10%.

7. A discharging method for a lithium secondary battery having an open-circuit voltage, the discharging method comprising:
   (1) discharging the lithium secondary battery for a first time period using a predetermined discharge current value to provide a predetermined voltage;
   (2) measuring an internal resistance in order to determine a measured internal resistance value by a method of cutting off the predetermined discharge current and measuring the open-circuit voltage in a second time period and comparing the predetermined voltage to the open-circuit voltage of the lithium secondary battery when the predetermined discharge current value is cut off;
   (3) modifying the predetermined discharge current value to a modified discharge current value according to the measured internal resistance value;

(4) discharging the lithium secondary battery for a third time period within the modified discharge current value, and
(5) subsequently repeating operations (2) to (4);
wherein each of operations (1) and (4) is performed during the first and third time periods of 10 ms to 100 seconds,
wherein in operation (2) the measuring of the internal resistance by the method of cutting off the constant current and measuring the open-circuit voltage is performed during the second time period of 8 ms to 8 seconds,
wherein the internal resistance is the resistance of a negative electrode comprised in the lithium secondary battery.

8. The discharging method of claim 7, wherein the allowable discharge current value modified in operation (3) according to the measured internal resistance value is adjusted so as to be inversely proportional to the measured internal resistance value.

9. The discharging method of claim 7, wherein, when operations (2) to (4) are sequentially repeated, when the internal resistance value measured in operation (2) increases, the allowable discharge current is decreased in operation (3).

10. The discharging method of claim 9, wherein, when the measured internal resistance value increases by 1%, the allowable discharge current value decreases by 0.1 to 10%.

11. The discharging method of claim 7, wherein, when operations (2) to (4) are sequentially repeated, when the internal resistance value measured in operation (2) decreases, the allowable discharge current is increased in operation (3).

12. The discharging method of claim 11, wherein, when the measured internal resistance value decreases by 1%, the allowable discharge current value increases by 0.1 to 10%.

* * * * *